(12) United States Patent
Aikawa et al.

(10) Patent No.: US 7,538,628 B2
(45) Date of Patent: May 26, 2009

(54) HARMONIC OSCILLATOR USING TRANSMISSION LINE RESONATOR

(75) Inventors: Masayoshi Aikawa, Saga (JP); Takayuki Tanaka, Saga (JP); Fumio Asamura, Saitama (JP); Kenji Kawahata, Saitama (JP); Katsuaki Sakamoto, Saitama (JP)

(73) Assignees: Nihon Dempa Kogyo Co., Ltd. (JP); Saga University (JP)

( * ) Notice: Subject to any disclaimer, the term of this patent is extended or adjusted under 35 U.S.C. 154(b) by 132 days.

(21) Appl. No.: 11/654,360

(22) Filed: Jan. 17, 2007

(65) Prior Publication Data
US 2007/0164830 A1    Jul. 19, 2007

(30) Foreign Application Priority Data
Jan. 18, 2006    (JP)    ................................ 2006-010531

(51) Int. Cl.
*H03B 5/18*    (2006.01)
*H03B 9/14*    (2006.01)

(52) U.S. Cl. ................. 331/107 SL; 331/53; 331/107 P

(58) Field of Classification Search ........... 331/107 SL, 331/107 P, 53, 96, 107 DP See application file for complete search history.

(56) References Cited

U.S. PATENT DOCUMENTS

| 7,119,625 | B2* | 10/2006 | Aikawa et al. | ......... 331/107 SL |
| 7,145,404 | B2* | 12/2006 | Aikawa et al. | ................. 331/96 |
| 2003/0090332 | A1 | 5/2003 | Aikawa et al. | |
| 2005/0174182 | A1 | 8/2005 | Aikawa et al. | |

* cited by examiner

*Primary Examiner*—Robert Pascal
*Assistant Examiner*—James E Goodley
(74) *Attorney, Agent, or Firm*—Muirhead and Saturnelli, LLC

(57) ABSTRACT

A harmonic oscillator comprises a transmission line resonator in which an oscillation frequency depends on an electrical length of a transmission line and both ends of the transmission line are electrical open ends; an active element for oscillation as a negative resistance connecting to the transmission line resonator; an output line connected to a midpoint portion of the transmission line resonator; and electrical and/or physical suppressing means for suppressing a voltage displacement distribution of second harmonic among the even-order harmonics. The suppressing means is provided at a position which is at least a minimum voltage displacement portion for the second harmonic between the midpoint portion and either ends of the transmission line resonator.

15 Claims, 12 Drawing Sheets

HARMONIC OSCILLATOR USING TRANSMISSION LINE RESONATOR

BACKGROUND OF THE INVENTION

1. Field of the Invention

The present invention relates to a harmonic oscillator for high frequency in, for example, microwave or millimeter-wave band, using a transmission line resonator, and more particularly a harmonic oscillator suitable for obtaining fourth harmonic having a frequency four times as high as that of a fundamental wave or second harmonic having a frequency two times as high as that of the fundamental wave, among harmonics related to the fundamental wave of an oscillation frequency.

2. Description of the Related Arts

A high-frequency oscillator is employed in an optical communication system or its peripheral equipment, for example, and high performance and low cost are required. As such a high-frequency oscillator, the present inventors have already proposed a harmonic oscillator using a transmission line resonator in each of US 2003/0090332 A1 and US 2005/0174182 A1. These harmonic oscillators are adapted to obtain even-order harmonics such as second-order harmonic (i.e. second harmonic) or four-order harmonic (i.e. fourth harmonic) related to a fundamental frequency (i.e. fundamental wave) of resonance in the resonator, with a simple configuration.

FIG. 1A is a plan view showing a conventional harmonic oscillator generating second harmonic and FIG. 1B is a view showing voltage displacement distributions of standing waves in the harmonic oscillator shown in FIG. 1A. Similarly, FIG. 2A is a plan view showing a conventional harmonic oscillator generating fourth harmonic and FIG. 2B is a view showing voltage displacement distributions of standing waves in the harmonic oscillator shown in FIG. 2A.

Each of the second harmonic oscillator and fourth harmonic oscillator consists of transmission line resonator 1 which comprises a transmission line having its both ends as electrical open ends, and active elements 2 for oscillation. Active elements 2 act as negative resistances. The transmission line resonator 1 is provided as microstrip line resonator 1A, for example. Microstrip line resonator 1A has a signal line on one main surface of substrate 3 made of a dielectric and a ground conductor on the other surface of substrate 3. The ground conductor is provided over almost entire surface of the other main surface. The length of the signal line, which is an electrical length of the signal line including effects of the dielectric coefficient of the substrate, is $\lambda_0/2$ where $\lambda_0$ is a wavelength corresponding to an oscillation frequency (fundamental wave $f_0$) and the signal line is provided in a linear form with its both ends as electrical open ends. Active elements 2 are connected to either ends of microstrip line resonator 1A, i.e. either ends of the signal line, each with capacitor 4 intervened. Capacitors 4 are intended to make coupling between resonator 1A and active elements 2 to be loose coupling, thereby enhancing independence of microstrip line resonator 1A.

In each of these oscillators, because microstrip line resonator 1A has its both ends as electrical open ends, two oscillating systems can be obtained in which active elements 2 for oscillation at both ends oscillate in opposite phase to each other with common microstrip line resonator 1A. In microstrip line resonator 1A, as illustrated in FIGS. 1B and 2B, fundamental wave $f_0$ occurs as a standing wave having maximum voltage displacement portions in opposite phase to each other at both ends of resonator 1A and a minimum voltage displacement portion (i.e. zero potential point) at a midpoint portion of resonator 1. In addition, even-order and odd-order harmonics are generated as standing waves based on fundamental wave $f_0$.

In this case, odd-order harmonics have voltage displacement distributions which are odd-symmetric with respect to the midpoint portion of microstrip line resonator 1A as a zero potential point and both ends are maximum voltage displacement portions in opposite phase to each other, as with the fundamental wave. On the other hand, even-order harmonics have voltage displacement distributions which are symmetric with respect to the midpoint portion of microstrip line resonator 1A as maximum voltage displacement portion and both ends of resonator 1A are maximum voltage displacement portions in phase or opposite phase in relation to the midpoint portion. In the figures, reference character $f_0$ denotes fundamental wave, reference character $2f_0$ denotes second harmonic, reference character $3f_0$ denotes third harmonic, and reference character $4f_0$ denotes fourth harmonic.

At the midpoint portion of microstrip line resonator 1A, microstrip line stab 5 having a length of about $\lambda_0/4$ where $\lambda_0$ is a wavelength corresponding to fundamental wave $f_0$ is provided so that the midpoint of resonator 1A is an electrical short-circuit end for the fundamental wave $f_0$ component. By means of stab 5, the midpoint portion which is a minimum voltage displacement portion of microstrip line resonator 1A is forcefully brought to be a zero potential point for fundamental wave $f_0$ so as to further ensure the symmetrical voltage displacement distribution.

Further, in the second harmonic oscillator shown in FIG. 1A, output line 6 is connected to the midpoint portion of microstrip line resonator 1A with capacitor 4 for loose coupling intervened therebetween. In this case, because the midpoint portion of microstrip line resonator 1A is a zero potential point for the fundamental wave $f_0$ component, the fundamental wave component does not basically appear on output line 6. Similarly, because the midpoint portion is a zero potential point also for odd-order harmonics, the odd-order harmonic components do not appear on output line 6, as well. On the contrary, in the case of even-order harmonics including second harmonic, the midpoint portion of microstrip line resonator 1A is a maximum voltage displacement portion as described above. Therefore, when output line 6 is connected at the midpoint portion, the even-order harmonics are outputted from output line 6. In this case, because output levels (i.e. amplification levels) of harmonic components decrease as the order of harmonics increases, second harmonic is eventually outputted as a main component from output line 6.

In the fourth harmonic oscillator shown in FIG. 2A, one ends of output lines 6a, 6b are connected to points at a distance $\lambda_0/8$ from either ends of microstrip line resonator 1A while the other ends of output lines 6a, 6b are connected in common. In this case, fundamental wave $f_0$ and odd-order harmonics having the order of three or more have voltages with opposite signs to each other at two points at a distance $\lambda_0/8$ from either ends, as shown in FIG. 2B with circles. Therefore, the fundamental wave component and odd-order harmonics components are not obtained from output lines 6 connected in common, because these voltages cancel with each other. On the contrary, in the case of even-order harmonics, for example second harmonic and sixth harmonic (not shown), points at a distance $\lambda_0/8$ from either ends, i.e. points dividing a length between the midpoint and the end points of the transmission line into two equal parts are zero potential points. Therefore, second harmonic and sixth harmonic are not outputted. Because the points at a distance $\lambda_0/8$ from either ends are maximum voltage displacement portions in phase to each other for fourth harmonic, fourth harmonic is outputted from output line 6. In this case, although 4n-th harmonics such as eighth harmonic or twelfth harmonic are also outputted from output line 6, these harmonics have the large orders and eventually fourth harmonic is outputted as a main component from output line 6, as described above.

It is also possible that output waveform of active element 2 for oscillation is distorted to relatively increase level of a harmonic related to fundamental wave $f_0$ so that second harmonic $2f_0$ or fourth harmonic $4f_0$ can be more easily extracted. In addition, although microstrip line resonator 1A takes a linear form, it may take a meandering curve form or even an annular form. Further, the transmission line resonator may be formed not only as a microstrip line resonator, but also as a slot line resonator, for example.

However, in the harmonic oscillators having the above describe configuration amplification level of a harmonic decreases as the order of the harmonic increases, with the largest amplification level in fundamental wave $f_0$. This is due to that active elements 2 for oscillation are connected to both ends of microstrip line resonator 1A which are maximum voltage displacement portions. Therefore, in both second harmonic and fourth harmonic oscillators, it is required to suppress amplification levels of the fundamental wave and harmonics which have lower orders and larger amplification level than that of second harmonic and fourth harmonic, respectively, among other things.

In the case of the second harmonic oscillator, because only one output line 6 is connected only at the midpoint portion of microstrip line resonator 1A, positioning accuracy of the connection position of the output line can be relatively high and therefore it is easy to suppress fundamental wave $f_0$ having the largest output level particularly. However, in the case of the fourth harmonic oscillator, because output lines 6 are connected at two points at a distance $\lambda_0/8$ from either ends of microstrip line resonator 1A, there is a problem that fundamental wave $f_0$, second harmonic $2f_0$, and third harmonic $3f_0$, which have larger amplification levels than that of fourth harmonic $4f_0$, can not be sufficiently suppressed due to mainly imbalance in the circuit configuration, for example.

Further, as described above, active elements 2 for oscillation are connected at either ends of the transmission line which are maximum voltage displacement portions of microstrip line resonator 1A. At the maximum voltage displacement portions, impedance is theoretically infinite and input impedance is substantially large indeed. Therefore, impedance matching with active elements 2 is difficult, which results in complicated design of the harmonic resonator. Because of the high input impedance, phase noise characteristics in active elements 2 for oscillation are also degraded.

SUMMARY OF THE INVENTION

It is an object of the present invention to provide a harmonic oscillator in which the fundamental wave and odd-order harmonics are suppressed.

It is another object of the present invention to provide a fourth harmonic oscillator in which the fundamental wave, second harmonic, and odd-order harmonic are suppressed and oscillation output of fourth harmonic with high quality can be easily obtained.

It is still another object of the present invention to provide a second harmonic resonator in which the fundamental wave, fourth harmonic, and odd-order harmonics are suppressed and oscillation output of second harmonic with high quality can be easily obtained.

The present invention is provided by considering the fact that the effect of suppressing the fundamental wave and unnecessary harmonics, in particular odd-order harmonics, is high when a single output line is connected only at a midpoint portion of a transmission line resonator in the above described second harmonic oscillator, because positioning accuracy of the connection position of the output line is high. The present invention is intended to make such a configuration applicable to also the fourth harmonic oscillator to suppress second harmonic. Further, the present invention is intended to make the similar configuration applicable to also the second harmonic oscillator to suppress fourth harmonic.

These objects of the present invention is accomplished by a harmonic oscillator comprising a transmission line resonator in which an oscillation frequency depends on an electrical length of a transmission line and both ends of the transmission line are electrical open ends, and an active element for oscillation as a negative resistance connecting to the transmission line resonator, the harmonic oscillator using the transmission line resonator in which each standing wave of a fundamental wave of the oscillation frequency and odd-order harmonics related to the fundamental wave has a minimum voltage displacement portion at a midpoint portion of the transmission line resonator and maximum voltage displacement portions in opposite phase to each other at both ends and the standing wave has a voltage displacement distribution which is odd-symmetric with respect to the midpoint portion; each standing wave of even-order harmonics related to the fundamental wave has a maximum voltage displacement portion at the midpoint portion of the transmission line resonator and maximum voltage displacement portions in phase or opposite phase in relation to the midpoint portion at both ends and the standing wave has a voltage displacement distribution which is symmetric with respect to the midpoint portion; and an output line is connected to the midpoint portion of the transmission line resonator to suppress output levels of the fundamental wave and odd-order harmonics, and the even-order harmonics are obtained on the output line, wherein in the transmission line resonator, suppressing means is provided for suppressing a voltage displacement distribution of second harmonic among the even-order harmonics; and the suppressing means is provided at a position between the midpoint portion and either ends of the transmission line resonator, the position being at least a minimum voltage displacement portion for the second harmonic.

In the configuration in this manner, because the output line is provided at the midpoint portion of the transmission line resonator, positioning accuracy of the connection position of the output line can be increased in comparison to the case when a plurality of output lines are connected to the transmission line resonator, which ensures suppression of fundamental wave and odd-order harmonics. In addition, in this configuration, suppressing means for second harmonic are provided at the positions of the minimum voltage displacement portions for second harmonic in the transmission line resonator. Therefore, second harmonic having larger amplification level than that of fourth harmonic is suppressed and (4n−2)-th harmonics are also suppressed because the minimum voltage displacement portions for second harmonic are also minimum voltage displacement portions for (4n−2)-th harmonics, where n is a positive integer. Thus, not only second harmonic having the low order, but also sixth harmonic having a larger order than that of fourth harmonic among even-order harmonics is suppressed so that fourth harmonic appears superiorly on the output line. In this configuration, not only fundamental wave, second harmonic, third harmonic having larger amplification levels than that of fourth harmonic are suppressed, but also fifth, sixth, and seventh harmonics which are higher-order harmonics close to fourth harmonic can be also suppressed. Therefore, fourth harmonic can be obtained with these lower-order and higher-order harmonics suppressed. However 4n-th even-order harmonics such as eighth harmonic or twelfth harmonic also appear in addition to fourth harmonic, these eighth and twelfth harmonics have larger orders and smaller output levels than that of fourth harmonic and an output having fourth harmonic as a main component is then obtained from the output line. However, 4n-th harmonics such as eighth harmonic or twelfth harmonic may be obtained by removing fourth harmonic by providing filters or the like. In this way, in the present invention, the order of harmonics outputted is limited, while the fourth harmonic oscillator having a simple configuration without filters can be obtained.

In the present invention, it is preferable that at least two active elements for oscillation are provided and two oscillating systems which oscillate in opposite phase to each other for the fundamental wave with the transmission line resonator in common are configured with these active elements. Because two oscillating systems oscillate in opposite phase to each other, a voltage displacement distribution which is symmetric with respect to the midpoint portion of the transmission line resonator is stably formed to obtain stable oscillation output. However, even if only one active element is provided, a standing wave of the fundamental wave is generated in the transmission line resonator inevitably in such a manner that both ends are maximum displacement portions in opposite phase to each other and the midpoint portion is a minimum voltage displacement portion, because the transmission line resonator has its both ends as electrical open ends.

The suppressing means is physical suppressing means and/or electrical suppressing means, for example.

In the present invention, electrical suppressing means is configured by connecting the active elements at positions of the minimum voltage displacement portions for second harmonic between the midpoint portion and either ends of the transmission line resonator, for example. Because the positions are the minimum voltage displacement portions (zero potential points) for second harmonic, i.e. portions where no voltage displacement is generated for second harmonic, second harmonic superposed on the fundamental wave tends not to be generated even if amplification voltages are applied or injected from the active elements for oscillation. As a result, the voltage displacement distribution and related output level of second harmonic are suppressed. Because the positions of the minimum voltage displacement portions for second harmonic are also minimum voltage displacement portions for (4n−2)-th harmonic such as sixth harmonic, not only second harmonic, but also sixth harmonic tends not to be generated if the active elements are connected at the positions. However, (4n−2)-th harmonics having the order of six or more have four or more minimum voltage displacement portions in the transmission line resonator and thus second harmonic which has only two minimum voltage displacement portions in the resonator is most suppressed, according to this configuration. In addition, because the positions of the minimum voltage displacement portions for second harmonic where amplification voltages are applied from the active elements are the voltage displacement portions for the fundamental wave, odd-order harmonics and fourth harmonic, the fundamental wave, odd-order harmonics, and fourth harmonic are generated with the active elements.

In this configuration, it is preferable that both ends of the transmission line resonator are unloaded ends. When the active elements are not connected to both ends of the resonator so that both ends are unloaded ends, the ends are independent complete electrical open ends. Therefore, a standing wave of fundamental wave in opposite phase to each other at both ends tends to be stably generated and it is easy to determine line length depending to the oscillation frequency of the transmission line resonator, for example.

In the present invention, as the physical suppressing means, stabs for suppressing the second harmonic can be used, for example, which are provided at positions which are minimum voltage displacement portions of the second harmonic between the midpoint portion and either ends of the transmission line resonator, i.e. positions which are maximum current displacement portions for second harmonic. If the stabs are provided in this manner, voltage displacement distributions of fourth harmonic and 4n-th harmonics are kept unchanged even with the stabs provided, because the minimum voltage displacement portions (i.e. maximum current displacement portions) of second harmonic are maximum voltage displacement portions and minimum current displacement portions where there is no current for fourth harmonic and 4n-th harmonics. Thus, by providing the stabs in this manner, second harmonic among others is suppressed so that output level of fourth harmonic is relatively large. Alternatively, in this configuration, active elements may be connected at either ends of the transmission line resonator. By connecting the active elements in this manner, the fundamental wave tends to be generated in such a manner that the midpoint portion is a minimum voltage displacement portion while both ends of the transmission line resonator are in opposite phase to each other.

In another configuration of the present invention, as the physical suppressing means, a stab for dropping voltage of second harmonic can be used which is provided at the midpoint portion of the transmission line resonator, i.e. at the position of the maximum voltage displacement portion of second harmonic. With the stab, maximum voltage value of second harmonic decreases to attenuate its voltage displacement distribution. In this case, because the maximum voltage displacement portion of second harmonic is the minimum voltage displacement portion where there is no voltage displacement for fourth harmonic, voltage drop of fourth harmonic can be basically avoided. Consequently, while keeping the voltage displacement distribution of fourth harmonic unchanged, second harmonic is suppressed so that output of fourth harmonic is relatively large. In the configuration in this manner, both ends of the transmission line resonator may be unloaded ends or the active elements for oscillation may be connected to both ends of the transmission line resonator.

Although the above described configuration is related to the case when fourth harmonic (or 4n-th harmonics) is generated in the harmonic oscillator according to the present invention, the present invention is also appropriately applicable to a second harmonic oscillator. In such a case, as electrical and/or physical suppressing means, means for suppressing the voltage displacement distribution of fourth harmonic among the even-order harmonics is used and the suppressing means is provided at minimum voltage displacement portions at least for fourth harmonic between the midpoint portion and either ends of the transmission line resonator. With this configuration, the output line is provided at the midpoint portion of the transmission line resonator to ensure suppression of output of the fundamental wave and odd-order harmonics, in the same manner as described above. Because the electrical or physical suppressing means for fourth harmonic are provided at the positions of minimum voltage displacement portions for fourth harmonic in the transmission line resonator, output level of fourth harmonic which is close to second harmonic among the even-order harmonics can be reduced to obtain oscillation output having second harmonic as a main component.

DETAILED DESCRIPTION OF THE PREFERRED EMBODIMENTS

First Embodiment

Figure 3A:
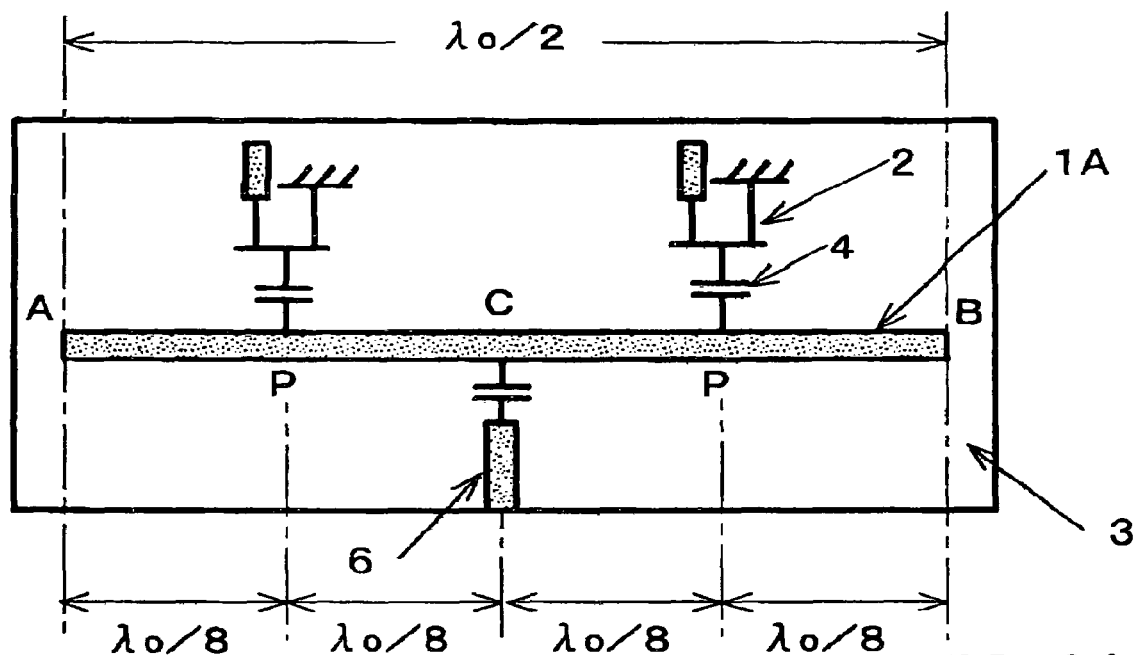
FIG. 3A is a plan view showing a configuration of a fourth harmonic oscillator according to a first embodiment of the present invention using a microstrip line resonator.
Figure 3B:
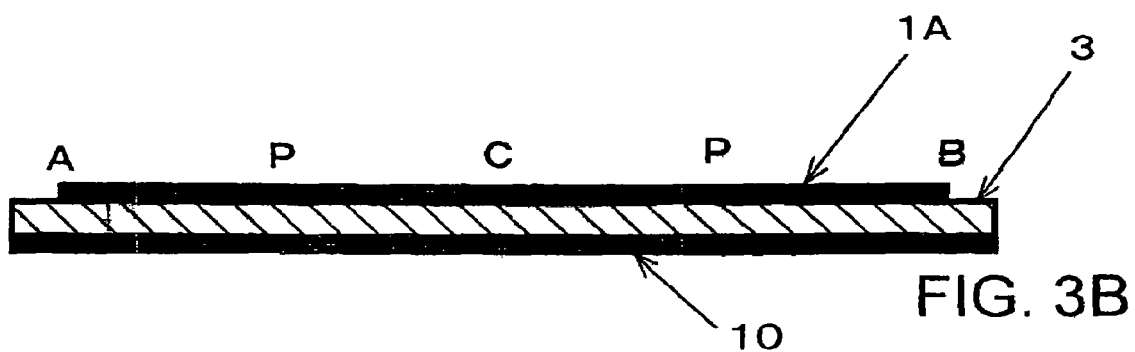
FIG. 3B is a cross-sectional view of the fourth harmonic oscillator shown in FIG. 3A.

A fourth harmonic oscillator of a first embodiment of the present invention shown in FIGS. 3A and 3B is configured by providing linear microstrip line resonator 1A as a transmission line resonator 1 on substrate 3 made of a dielectric and the oscillator generates signal having a frequency four times as high as that of fundamental frequency (fundamental wave) $f_0$ of oscillation by resonance in the resonator. The signal line of microstrip line resonator 1A is provided on one main surface of substrate 3, and ground conductor 10 is provided over almost entire surface of the other main surface of substrate 3. In this fourth harmonic oscillator, as described above, linear microstrip line resonator 1A has a length of $\lambda_0/2$ where $\lambda_0$ is a wavelength corresponding to fundamental wave $f_0$, and two active elements 2 oscillating in opposite phase to each other are connected to resonator 1A through capacitors 4 for loose coupling. In addition, output line 6 for taking out oscillation output is connected to resonator 1A through capacitors 4 for loose coupling. In this configuration, in order to electrically suppress level of second harmonic, active elements 2 for oscillation are connected at positions P at a distance $\lambda_0/8$ from either ends A, B, which are electrical open ends of microstrip line resonator 1A, toward the center, i.e. at points dividing a length between midpoint (i.e. center point) C of resonator 1A and either end points A, B into two equal parts. Further, output line 6 is connected at midpoint C of resonator 1A, i.e. at a point at a distance $\lambda_0/4$ from the ends of resonator 1A.

Figure 4:
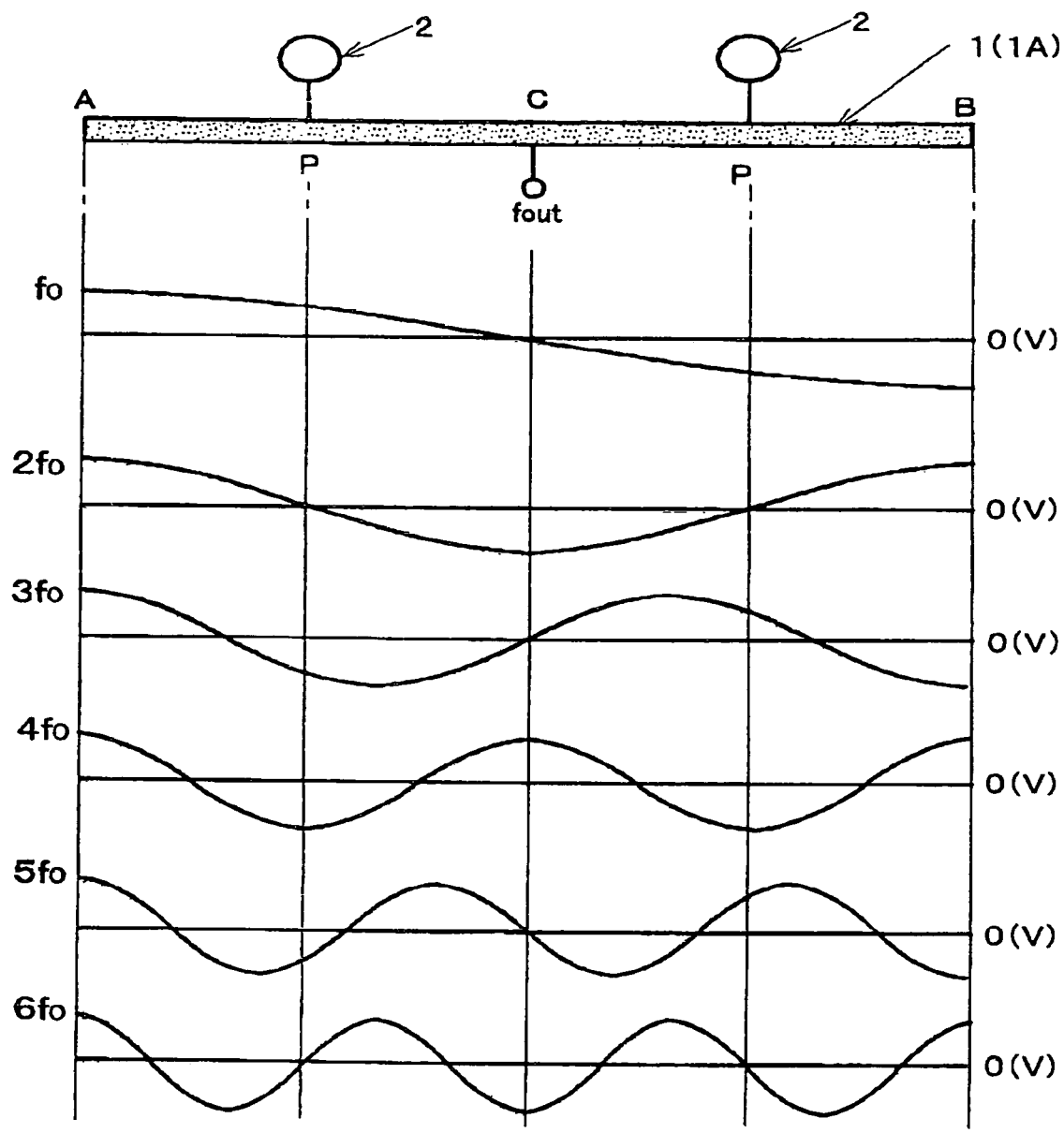
FIG. 4 is a view showing voltage displacement distributions of the fundamental wave and second to sixth harmonic components in the fourth harmonic oscillator shown in FIGS. 3A and 3B.

In this oscillator, for fundamental wave $f_0$ component, midpoint C of resonator 1A is a minimum voltage displacement point and both ends A, B of resonator 1A are maximum voltage displacement points in opposite phase to each other, as shown in FIG. 4. Therefore, positions P where active elements 2 are connected, i.e. positions at a distance $\lambda_0/8$ from either ends of microstrip line resonator 1A toward the center are voltage displacement portions between the minimum voltage displacement portion and the maximum voltage displacement portion for fundamental wave $f_0$. Also, positions P are voltage displacement portions for odd-order harmonics such as third harmonic $3f_0$ and fifth harmonic $5f_0$. Positions P are minimum voltage displacement portions (i.e. zero potential points) for $(4n-2)$-th harmonics such as second harmonic $2f_0$ and sixth harmonic $6f_0$ among even-order harmonics, while positions P are maximum voltage displacement portions for $4n$-th harmonics such as fourth harmonic $4f_0$ and eighth harmonic $8f_0$.

In this configuration, because amplification outputs from active elements 2 are injected and applied to positions P which are the voltage displacement portions for fundamental wave $f_0$ at a distance $\lambda_0/8$ from either ends A, B of resonator 1A, fundamental wave $f_0$ oscillates with both ends A, B of microstrip line resonator 1A as electrical open ends in the same manner as is described above. In this case, while active elements 2 connect to resonator 1A, positions P of these connection points are at a distance $\lambda_0/8$ from either ends A, B of resonator 1A and both ends A, B of resonator 1A act as independent electrical open ends which are unloaded ends Therefore, both ends of resonator 1A are maximum voltage displacement points in opposite phase to each other, for the fundamental wave. Thus, without providing a stab having a length of $\lambda_0/4$ at midpoint of microstrip line resonator 1A as in the conventional example, midpoint C of resonator 1A can be precisely a minimum voltage displacement portion (zero potential point) for the fundamental wave. Of course, the stab having a length of approximately $\lambda_0/4$ may be provided to midpoint C of resonator 1A.

In this fourth harmonic oscillator, along with fundamental wave $f_0$, related odd-order and even-order harmonics are generated in microstrip line resonator 1A, as in the conventional resonators. The fundamental wave and odd-order harmonics have minimum voltage displacement point at midpoint C of microstrip line resonator 1A and exhibit voltage displacement distributions which are odd-symmetric with respect to midpoint C. Both ends A, B are maximum voltage displacement portions in opposite phase to each other. On the other hand, even-order harmonics have maximum voltage displacement portion at midpoint C and exhibit voltage displacement distributions which are symmetric with respect to point C. Both ends A, B of resonator 1A are maximum voltage displacement portions in opposite phase to midpoint C for (4n−2)-th harmonics such as second harmonic and sixth harmonic, while both ends A, B are maximum voltage displacement portions in phase with midpoint C for 4n-th harmonics such as fourth harmonic and eighth harmonic.

In this configuration, arrangement, output line 6 is connected at midpoint portion C of microstrip line resonator 1A. Because point C is a zero potential point for the voltage displacement distributions of the fundamental wave and odd-order harmonics, the fundamental wave and odd-order harmonics do not appear on output line 6, in principle. Therefore, in this configuration, the fundamental wave and odd-order harmonics can be basically suppressed. On the contrary, with regard to even-order harmonics related to fundamental wave $f_0$, the even-order harmonics appear on output line 6 as they are, because midpoint C of microstrip line resonator 1A is a maximum voltage displacement portion. However, in this oscillator, amplification outputs from active elements 2 are injected to positions P at a distance $\lambda_0/8$ from either ends A, B of microstrip line resonator 1A toward the center. Because positions P are zero potential points for second harmonic, second harmonic tends not to be generated in resonator 1A even if the amplification outputs are injected to positions P. Thus, the voltage displacement distribution and related output level of second harmonic are suppressed. Because positions P are minimum voltage displacement portions not only for second harmonic, but also for (4n−2)-th harmonics such as sixth harmonic and tenth harmonic, (4n−2)-th harmonics having the order of 6 or more are also suppressed. However, because (4n−2)-th harmonics having the order of 6 or more have more minimum voltage displacement portions other than positions P as the order increases, the voltage displacement distribution of second harmonic is most suppressed in this configuration.

For fourth harmonic, positions P are maximum voltage displacement points. Therefore, the amplification outputs are injected to maximum voltage displacement points so that fourth harmonic tends to be generated in comparison with second harmonic which has the order lower than that of fourth harmonic. For example, the voltage displacement distribution of fourth harmonic becomes larger than that of second harmonic so as to suppress output level of second harmonic. Here, because positions P are maximum voltage displacement points not only for fourth harmonic, but also for 4n-th harmonics such as eighth harmonic and sixteenth harmonic, 4n-th harmonics having the order of 8 or more also tend to be generated. However, because 4n-th harmonics having the order of 8 or more have more maximum voltage displacement portions other than the maximum voltage displacement portions of fourth harmonic as the order increases, fourth harmonic especially tends to be generated here. In addition, because the level of harmonic typically increases as the order decreases, output level of fourth harmonic which has the lowest order among 4n-th harmonics becomes dominant here.

In this way, in the fourth harmonic oscillator in this embodiment, output levels of the fundamental wave and odd-order harmonics are suppressed by obtaining output from midpoint C of microstrip line resonator 1A. Moreover, because active elements 2 are placed at positions P at a distance $\lambda_0/8$ from either ends A, B of microstrip line resonator 1A, second harmonic is suppressed and fourth harmonic is superiorly generated. Therefore, according to this embodiment, the fourth harmonic oscillator in which the fundamental wave, second harmonic, and third harmonic are suppressed can be obtained.

In addition, while both ends A, B as open ends are maximum voltage displacement portions which exhibit infinite impedance, positions P where active elements 2 are connected in this embodiment, i.e. positions at a distance $\lambda_0/8$ from either ends A, B of resonator 1A, are voltage displacement portions which are not maximum voltage displacement portions, and therefore impedance at position P is small. Thus, impedance matching with active element 2 can be readily performed and design performance of the oscillator can be also significantly improved.

Further, in the above described configuration, it is not necessary to provide a stab having a length of $\lambda_0/4$ to midpoint C of resonator 1A and further it is necessary to connect only one output line 6. Therefore, the configuration is simplified in comparison with the conventional fourth harmonic oscillator.

Figure 5:
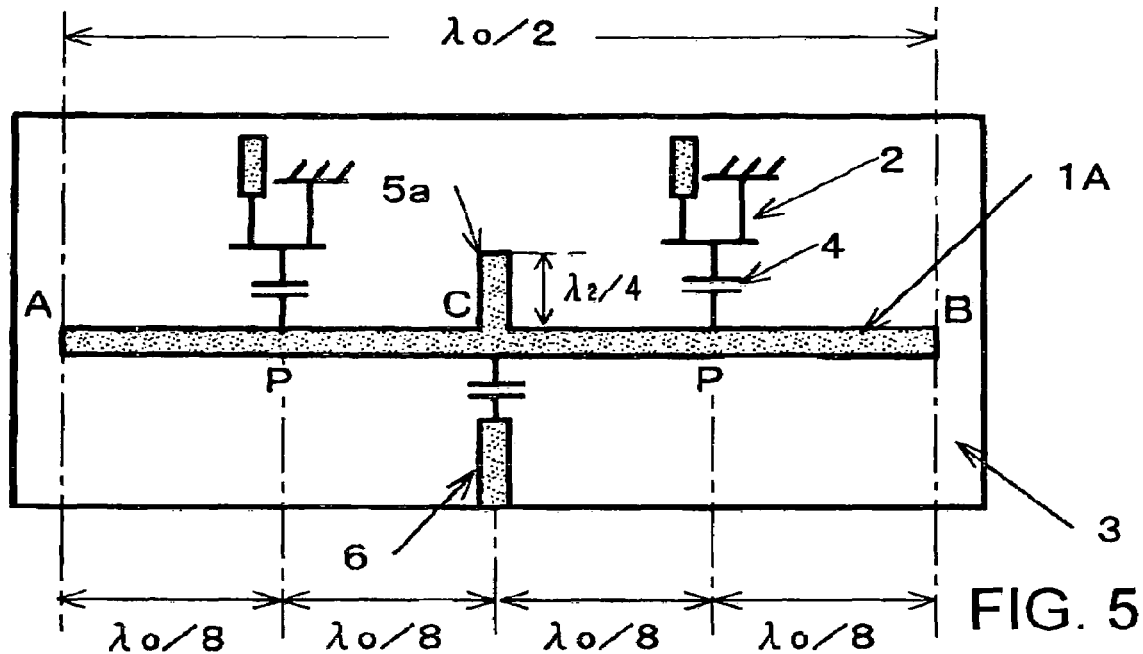
FIG. 5 is a plan view showing another configuration of the fourth harmonic oscillator according to the first embodiment of the present invention.

Although midpoint C of microstrip line resonator 1A is a minimum voltage displacement portion for fundamental wave $f_0$ and a maximum voltage displacement portion for second harmonic in this embodiment, for example, microstrip line stab 5a may be connected at midpoint C of resonator 1A, the stab having a length of $\lambda_2/4$, i.e. $\lambda_0/8$, where $\lambda_2$ is a wavelength corresponding to second harmonic $2f_0$, as shown in FIG. 5. In this case, because stab 5a having a length of $\lambda_2/4$ acts as an electrical short-circuit end for second harmonic $2f_0$, voltage of the maximum voltage displacement portion of second harmonic $2f_0$ can be dropped to further attenuate and suppress the voltage displacement distribution of second harmonic. In short, the microstrip line stab having a length of $\lambda_2/4$ acts as a voltage dropping stab provided to the maximum voltage displacement portion of second harmonic $2f_0$. By using the configuration shown in FIG. 5, fourth harmonic can be obtained with second harmonic component further suppressed.

Figure 6A:
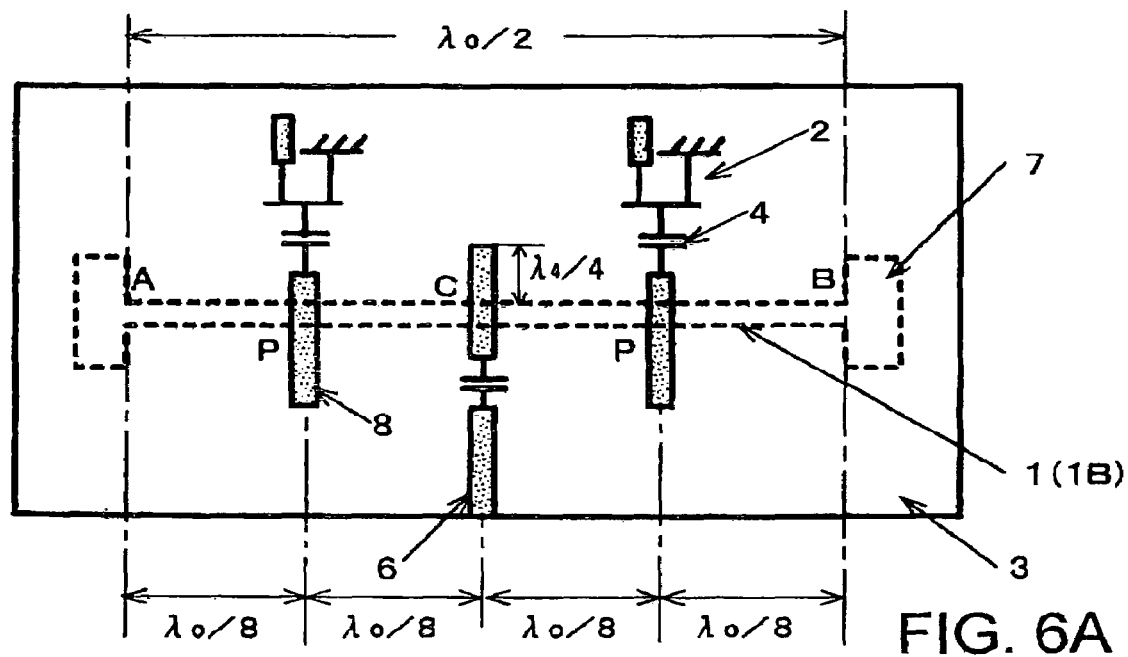
FIG. 6A is a plan view showing a configuration of the fourth harmonic oscillator according to the first embodiment of the present invention using a slot line resonator.
Figure 6B:
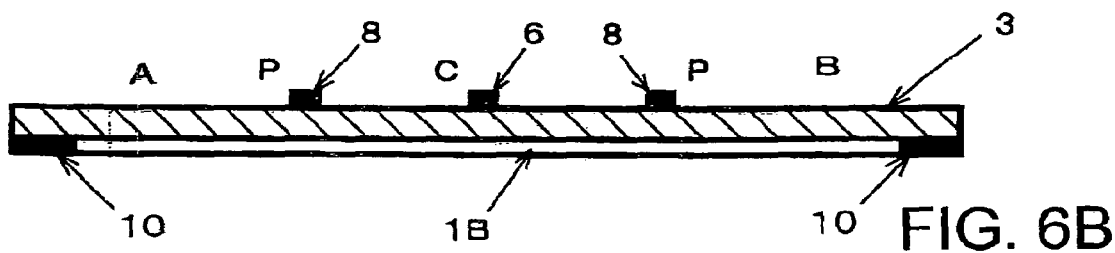
FIG. 6B is a cross-sectional view of the fourth harmonic oscillator shown in FIG. 6A.

Although the fourth harmonic oscillator shown in FIGS. 3A and 3B uses microstrip line resonator 1A as a transmission line resonator, a slot line resonator may be used instead of a microstrip line resonator. A fourth harmonic oscillator using slot line resonator 1B is illustrated in FIGS. 6A and 6B. In the case where a slot line resonator is used, no signal line of the resonator is provided on the surface of substrate 3. Slot line resonator 1B is achieved by an elongated opening formed in ground conductor 10 provided on the back side of substrate 3.

Slot line resonator 1B is formed by providing a linear (slot-like) opening part having a length of $\lambda_0/2$ in ground conductor 10 where $\lambda_0$ is a wavelength corresponding to fundamental wave $f_0$ in the same manner as is described above. A pair of open parts 7 are provided in ground conductor 10 such that open parts 7 to connect to both ends A, B of slot line resonator 1B. Open parts 7 are sufficiently larger than slot width of slot line resonator 1B and have a rectangular shape, for example. By forming open parts 7, both ends of slot line resonator 1B act as electrical open ends. The shape of open parts 7 provided in the ground conductor is not limited to rectangular, but may be circular or the like. Any shape is possible for open parts 7 as long as opening width of the slot line is widened so that electric field coupling between both sides of the slot line is small in order to interrupt traveling of high frequency signals and consequently the ends act as electrical open ends.

Also in this embodiment, active elements 2 for oscillation electrically connect to resonator 1B at positions P at a distance $\lambda_0/8$ from either ends A, B of slot line resonator 1B toward the center, i.e. positions P dividing a length between midpoint C and either ends A, B of resonator 1B into two equal parts. In this case, microstrip lines 8 for feeding are provided at positions P on one main surface of substrate 3, the lines extending in a direction orthogonal to the direction in which slot line resonator 1B extends, and active elements 2 are connected to microstrip lines 8 with capacitors 4 for loose coupling intervened therebetween. Because microstrip lines 8 electromagnetically couple to slot line resonator 1B, amplification outputs from active elements 2 can be supplied and injected to slot line resonator 1B. Here, microstrip lines 8 project across slot line resonator 1B to increase the degree of coupling. By providing and electrically connecting microstrip lines 8 to active elements 2 in this manner, fundamental wave $f_0$ components oscillates in opposite phase to each other in slot line resonator 1B.

Output line 6 is formed of a microstrip line-and provided on the surface of substrate 3 to electrically connect to midpoint C of slot line resonator 1B. In this case, the microstrip line as output line 6 projects across slot line resonator 1B. The projection length of output line 6 is $\lambda_4/4$ where $\lambda_4$ is a wavelength corresponding to fourth harmonic $4f_0$ and this length acts as an electrical short-circuit end for fourth harmonic $4f_0$ so that electromagnetic coupling of output line 6 and slot line resonator 1B is tight for fourth harmonic component.

With the configuration in this manner, the fundamental wave and even-order and odd-order harmonics which are similar to that in the fourth harmonic oscillator shown in FIGS. 3A and 3B are generated in slot line resonator 1B (see FIG. 4). Because output is obtained from midpoint C of slot line resonator 1B, outputs of the fundamental wave and odd-order harmonics are suppressed. In addition, amplification outputs from active elements 2 are injected to positions P at a distance $\lambda_0/8$ from either ends A, B of resonator 1B, i.e. positions which are minimum voltage displacement portions for second harmonic and maximum voltage displacement portion for fourth harmonic, so that second harmonic tends not to be generated and fourth harmonic tends to be generated. Further, in this configuration, output line (i.e. microstrip line) 6 is projected by $\lambda_4/4$ from the traversing point with slot line resonator 1B so that the electromagnetic coupling with fourth harmonic is tight and thereby output of fourth harmonic can be further increased. In this way, also in the fourth harmonic oscillator shown in FIGS. 6A and 6B, outputs of the fundamental wave, second harmonic, and third harmonic can be suppressed to obtain output having fourth harmonic as a main component.

Second Embodiment

Figure 1A:
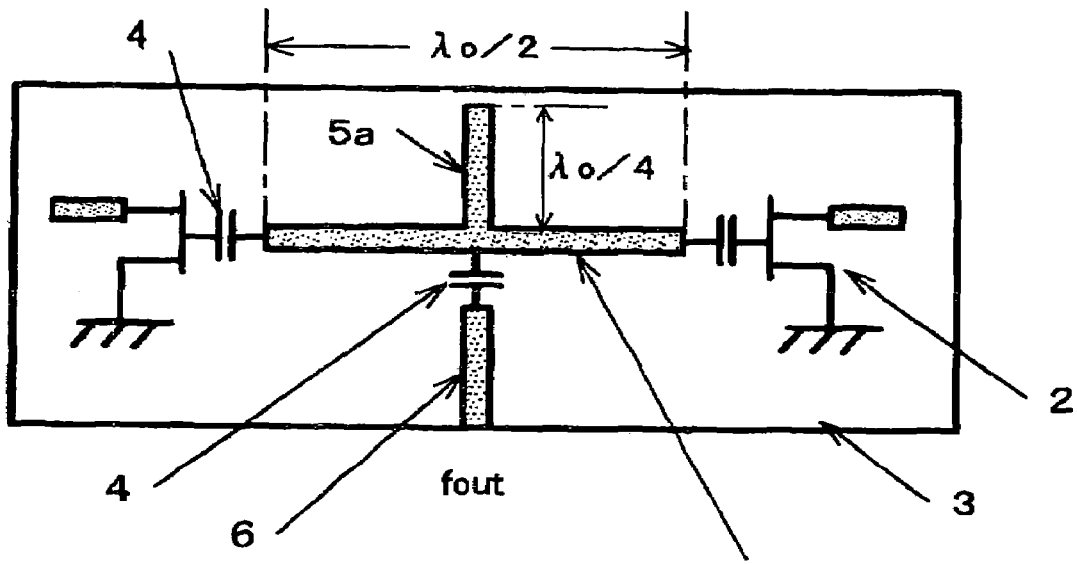
FIG. 1A is a plan view showing a configuration of a conventional second harmonic oscillator.
Figure 1B:
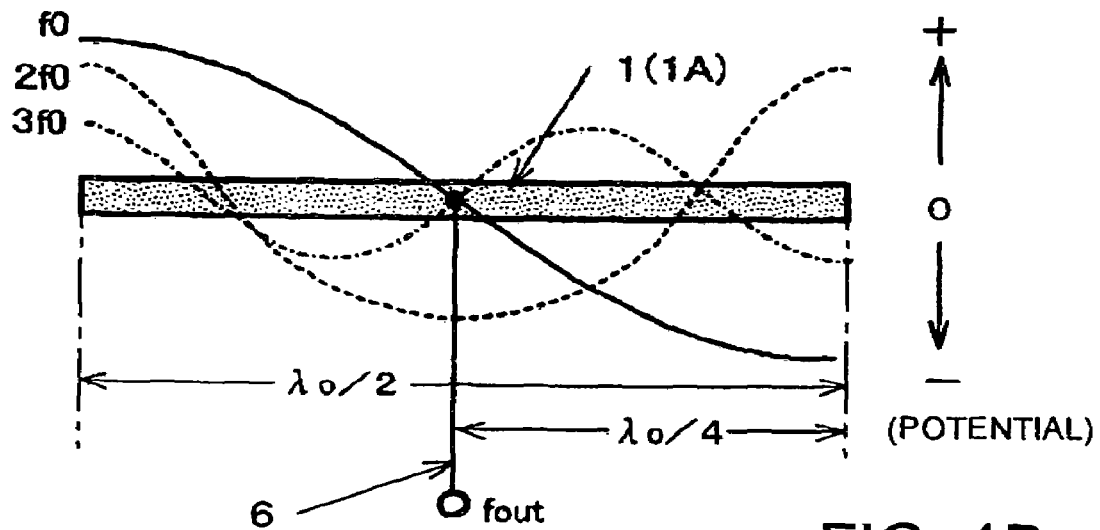
FIG. 1B is a view showing voltage displacement distributions of standing waves in the second harmonic oscillator shown in FIG. 1A.
Figure 2A:
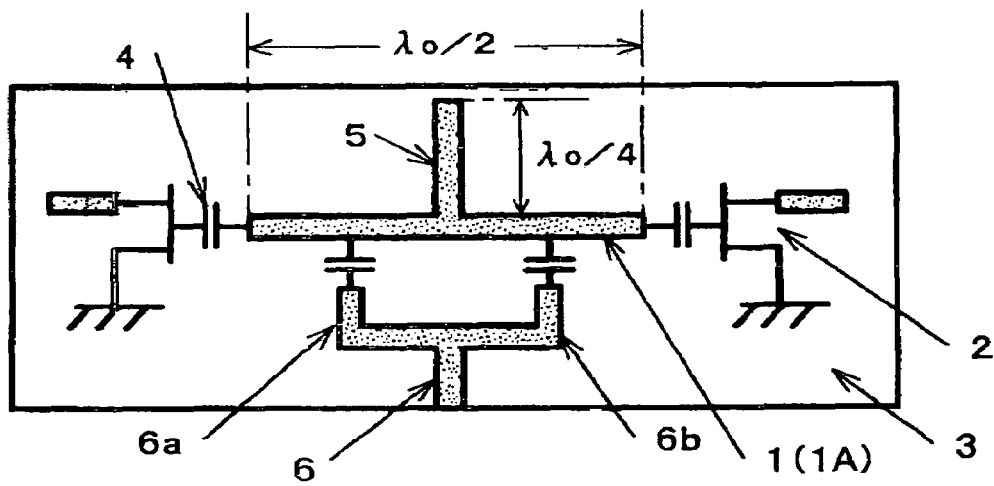
FIG. 2A is a plan view showing a configuration of a conventional fourth harmonic oscillator.
Figure 2B:
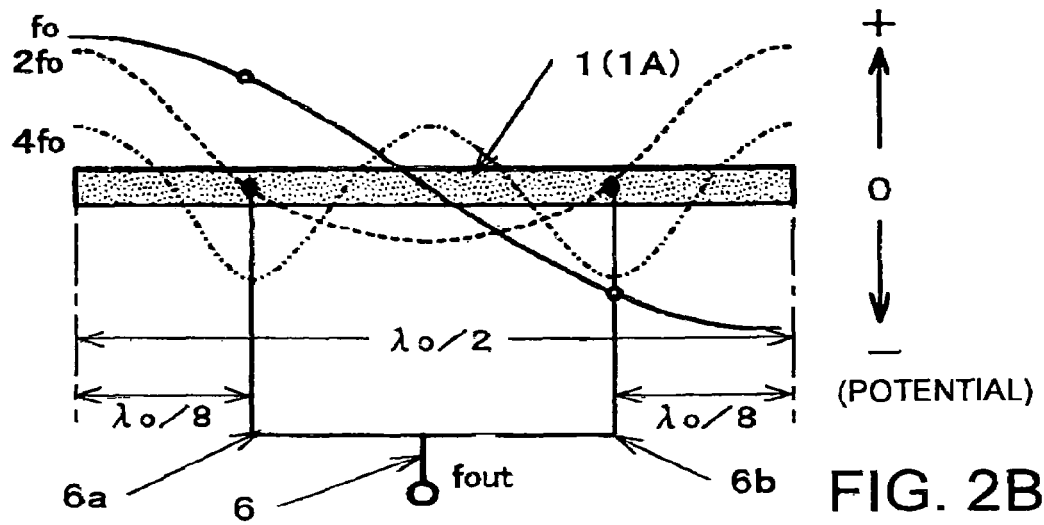
FIG. 2B is a view showing voltage displacement distributions of standing waves in the fourth harmonic oscillator shown in FIG. 2A.

Next, a second embodiment of the present invention will be described. In a fourth harmonic oscillator according to the second embodiment of the present invention shown in FIG. 7, as in the conventional fourth harmonic oscillator shown in FIG. 1, active elements 2 for oscillation are connected at both ends A, B of microstrip line resonator 1A and output line 6 is connected at midpoint C. In order to physically suppress generation of second harmonic in resonator 1A, slot line stabs 5b are provided at positions at a distance $\lambda_0/8$ from either ends of microstrip line resonator 1A toward the center where $\lambda_0$ is a wavelength corresponding to fundamental wave $f_0$, i.e. positions which are minimum voltage displacement portions for second harmonic.

Slot line stabs 5b are configured by providing slot-like opening parts in a ground conductor on the back side of substrate 3 made of a dielectric and longitudinal directions of the opening parts are orthogonal to the direction in which microstrip line resonator 1A extends. At the midpoint portion of microstrip line resonator 1A, microstrip line stab 5a having a length of $\lambda_2/4$ is provided to be an electrical short-circuit end for second harmonic.

In this fourth harmonic oscillator, as in the conventional oscillator, along with the fundamental wave, even-order and odd-order harmonics are generated in microstrip line resonator 1A (see FIG. 4). Because the midpoint portion of microstrip line resonator 1A at which output line 6 is connected is a minimum voltage displacement portion (zero potential point) for the fundamental wave and odd-order harmonics, outputs of the fundamental wave and odd-order harmonics are suppressed. In addition, at the positions at a distance $\lambda_2/4$ ($=\lambda_0/8$) from either ends of resonator 1A which are voltage minimum displacement points, i.e. maximum current displacement points for second harmonic, slot line stabs 5b are provided to be electrical open ends for second harmonic as the physical suppressing means (i.e., unwanted wave suppressing means) having a length shorter than the electric length of $\lambda_2/4$. With stabs 5b, currents from the maximum current displacement points for second harmonic are suppressed and accordingly injection of resonance energy of second harmonic component is suppressed. Moreover, at the midpoint portion of resonator 1A, stab 5a is provided which acts as an electrical short-circuit end for second harmonic to drop voltage of second harmonic component. Therefore, voltage from the maximum voltage displacement portion for second harmonic is also attenuated so that the voltage displacement distribution of second harmonic is weakened and suppressed.

Thus, according to this configuration, second harmonic is suppressed which has intrinsically a higher amplification level than that of fourth harmonic. The fundamental wave and third harmonic, which have intrinsically lower orders and larger amplification levels than that of fourth harmonic, are suppressed by providing output line 6 at the midpoint portion of resonator 1A, while second harmonic is suppressed with stabs 5a, 5b, so that the fourth harmonic oscillator which outputs fourth harmonic superiorly can be obtained.

Figure 7:
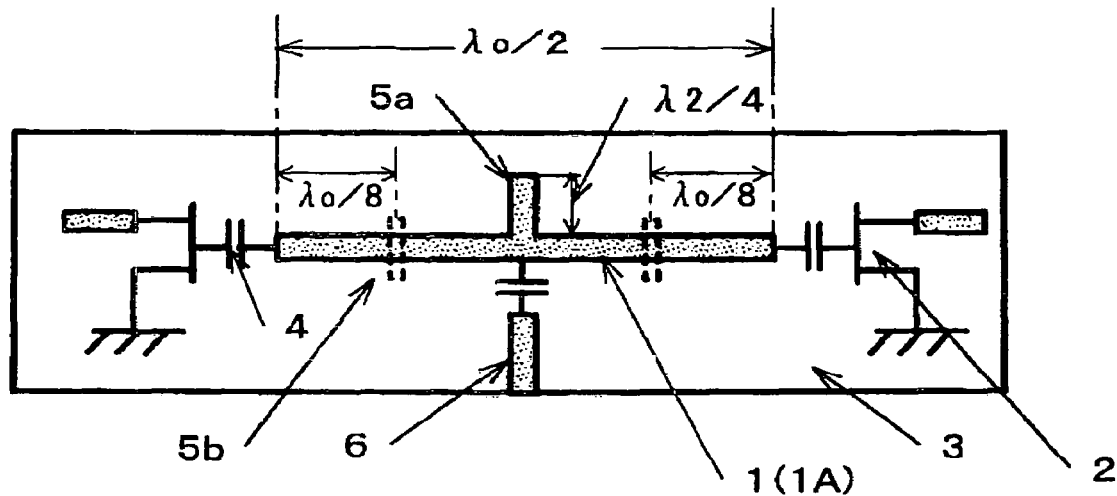
FIG. 7 is a plan view showing a configuration of a fourth harmonic oscillator according to a second embodiment of the present invention using a microstrip line resonator.
Figure 8:
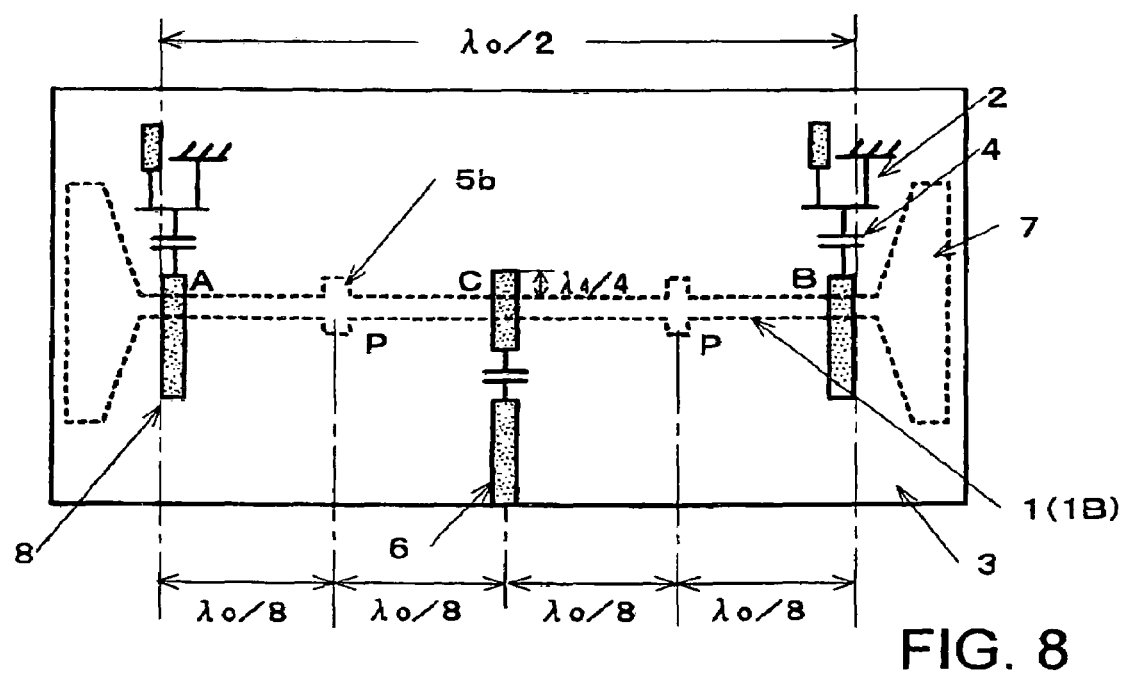
FIG. 8 is a plan view showing a configuration of the fourth harmonic oscillator according to the second embodiment of the present invention using a slot line resonator.

Although the fourth harmonic oscillator shown in FIG. 7 uses microstrip line resonator 1A as a transmission line resonator, a slot line resonator may be used instead of a microstrip line resonator. FIG. 8 illustrates a fourth harmonic oscillator using slot line resonator 1B.

The fourth harmonic oscillator shown in FIG. 8 is the same as the fourth harmonic oscillator shown in FIGS. 6A and 6B except that positions at which active elements 2 are electrically connected to slot line resonator 1B are different and slot line stabs 5b are provided. In other words, slot line resonator 1B having its both ends as electrical open ends is provided as in the case shown in FIGS. 6A and 6B and microstrip lines 8 for feeding are provided to project from traversing points with resonator 1B, in correspondence with positions of both ends A, B of resonator 1B. Slot line stabs 5b have the same shape as the stabs in the oscillator shown in FIG. 7 and are provided to slot line resonator 1B at positions at a distance $\lambda_0/8$ from either ends A, B of resonator 1B toward midpoint C. In addition, a microstrip line projecting by a length of $\lambda_4/4$, where $\lambda_4/4$ is a wavelength corresponding to fourth harmonic $4f_0$, is provided as output line 6 at midpoint portion C of slot line resonator 1B. As a result, as in the case shown in FIG. 7, the output level of fourth harmonic can be further increased. Here, open parts 7 connected to both ends of slot line resonator 1B have a gradually widening shape in order to prevent electromagnetic coupling with microstrip line 8 for feeding.

According to this configuration, as in the configuration shown in FIG. 7, output is obtained from the midpoint portion of slot line resonator 1B so that the fundamental wave and odd-order harmonics are suppressed. Because slot line stabs 5b provided at positions P of minimum voltage displacement portions for second harmonic at a distance $\lambda_0/8$ from either ends A, B act as physical means for suppressing second harmonic, the voltage displacement distribution of second harmonic is attenuated. Consequently, the fundamental wave, second harmonic, and third harmonic can be suppressed to obtain fourth harmonic having higher output lever than that of these harmonics.

In the configuration shown in FIG. 8, as in the configuration shown in FIG. 5, when slot line stab 5 having a length of $\lambda_2/4$ where $\lambda_2$ is a wavelength of second harmonic is provided at midpoint portion C of slot line resonator 1B to act as an electrical short-circuit end, the stab acts as a voltage dropping stab inserted at the maximum voltage displacement point so that second harmonic can be further suppressed.

Third Embodiment

Figure 9A:
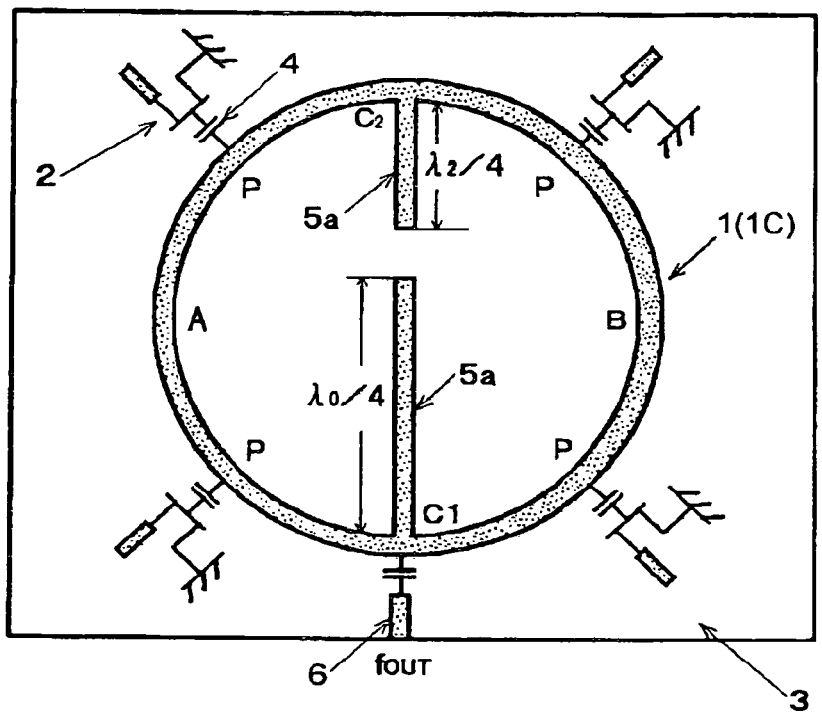
FIG. 9A is a plan view showing a configuration of a fourth harmonic oscillator according to a third embodiment of the present invention using a microstrip line resonator.

Next, a third embodiment of the present invention will be described. Although a transmission line resonator provided in a linear form is used in the above described first and second embodiments, the shape of the transmission line resonator is not limited to the linear form, but may be annular, for example. FIG. 9A shows a fourth harmonic oscillator which corresponding to the oscillator shown in FIGS. 3A and 3B but uses annular microstrip line resonator 1C instead of the linear microstrip line resonator.

Microstrip line ring resonator 1C is provided on the surface of substrate 3 in an annular form in which its circumferential length is $\lambda_0$ where $\lambda_0$ is a wavelength corresponding to fundamental wave $f_0$. Therefore, half circumferential length in ring resonator 1C is $\lambda_0/2$. At position C1 which is the bottom end of the circle in FIG. 9A, microstrip line stab 5a which has a length of $\lambda_0/4$ and acts as an electrical short-circuit end for fundamental wave $f_0$ is connected to ring resonator 1C. Thereby, a standing wave of fundamental wave $f_0$ is generated along the circumference of microstrip line ring resonator 1C in such a manner that point C1 in the bottom side of ring resonator 1C is a minimum voltage displacement portion (zero potential point). Referring to top end position C2 in the figure of ring resonator 1C, the standing wave of fundamental wave $f_0$ is formed in such a manner that top and bottom ends C1, C2 of microstrip line ring resonator 1C are minimum voltage displacement portions and left and right ends A, B in the figure are maximum voltage displacement portions in opposite phase to each other. In other words, the standing wave of fundamental wave $f_0$ is formed for each upper and lower arc in such a manner that both ends A, B of microstrip line ring resonator 1C are maximum voltage displacement portions in opposite phase to each other and midpoint portions C1, C2 of respective upper and lower arcs in the figure which are formed between left and right ends A, B are minimum voltage displacement portions. This corresponds to parallel connection of a pair of linear microstrip line resonators 1A having both ends as electrical open ends as described above.

In the resonator shown in FIG. 9A, as in the case shown in FIGS. 3A and 3B, in order to electrically suppress second harmonic, active elements 2 for oscillation are connected at positions at a distance $\lambda_0/8$ from left and right ends A, B Which are maximum voltage displacement points along the circumference of resonator 1B, i.e. a midpoint between point A and point C1, a midpoint between point A and point C2, a midpoint between point B and point C1, and a midpoint between point B and point C2, respectively. In addition, output line 6 is connected to point C1 which is the midpoint portion of one arc of microstrip line ring resonator 1C. Oscillation output $f_{out}$ is obtained from output line 6. At point C2 which is the midpoint portion of the other arc of ring resonator 1C, microstrip line stab 5a having a length of $\lambda_2/4$ is provided, where $\lambda_2$ is a wavelength corresponding to second harmonic $2f_0$. Stab 5a acts as an electrical short-circuit end for second harmonic $2f_0$ to drop voltage of second harmonic component.

Figure 9B:
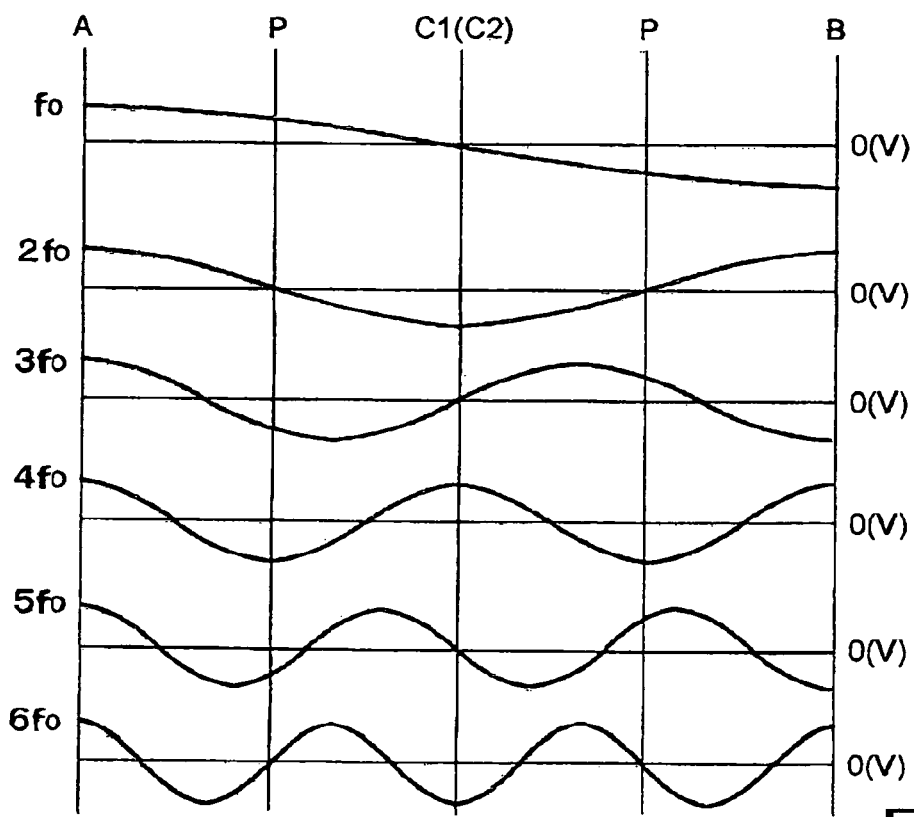
FIG. 9B is a view showing voltage displacement distribution of the fundamental wave and second to sixth harmonic components in the fourth harmonic oscillator shown in FIG. 9A.

In the fourth harmonic oscillator in this manner, as shown in FIG. 9B, points P where active elements 2 connect to ring resonator 1C to inject amplification voltages, i.e. points P at a distance $\lambda_0/8$ from maximum voltage displacement points in left and right ends A, B are voltage displacement points for fundamental wave $f_0$. Therefore, as described above, fundamental wave $f_0$ is generated in such a manner that left and right ends A, B of microstrip line ring resonator 1C are maximum voltage displacement portions in opposite phase to each other and top and bottom ends C1, C2 are zero potential points, and even-order and odd-order harmonics are also generated accordingly.

Consequently, each upper and lower half circumferential arc of microstrip line ring resonator 1C is regarded as microstrip line resonator 1A in the first embodiment, and the fundamental wave and harmonics are generated with left and right ends A, B as imaginary electrical open ends. Also in this case, the fundamental wave and odd-order harmonics are suppressed because output is taken out from midpoint portion C1 of a half circumferential arc of microstrip line ring resonator 1C.

Further, points P where active elements 2 connect to inject amplification voltages are voltage displacement points for the fundamental wave, minimum voltage displacement portions (zero potential points) for second harmonic, and maximum voltage displacement points for fourth harmonic. Therefore, second harmonic is suppressed and fourth harmonic is enhanced, among even-order harmonics. In this case, although points P are also minimum voltage displacement portions for (4n−2)-th harmonics and maximum voltage displacement portions for 4n-th harmonics, the effect on second harmonic and fourth harmonic is largest as described above.

Consequently, also in the fourth harmonic oscillator shown in FIG. 9A, the fundamental wave and third harmonic among others are suppressed with output line 6 and second harmonic is suppressed by electrical suppressing means with active elements 2. Therefore, the fourth harmonic oscillator in which amplification level of fourth harmonic is largest can be obtained. In addition, impedance matching can be more conveniently performed because active elements 2 are connected to voltage displacement portions at a distance $\lambda_0/8$ from maximum voltage displacement portions of the fundamental wave, and the phase noise characteristics can be improved because the number of connected active elements 2 is large.

Figure 10:
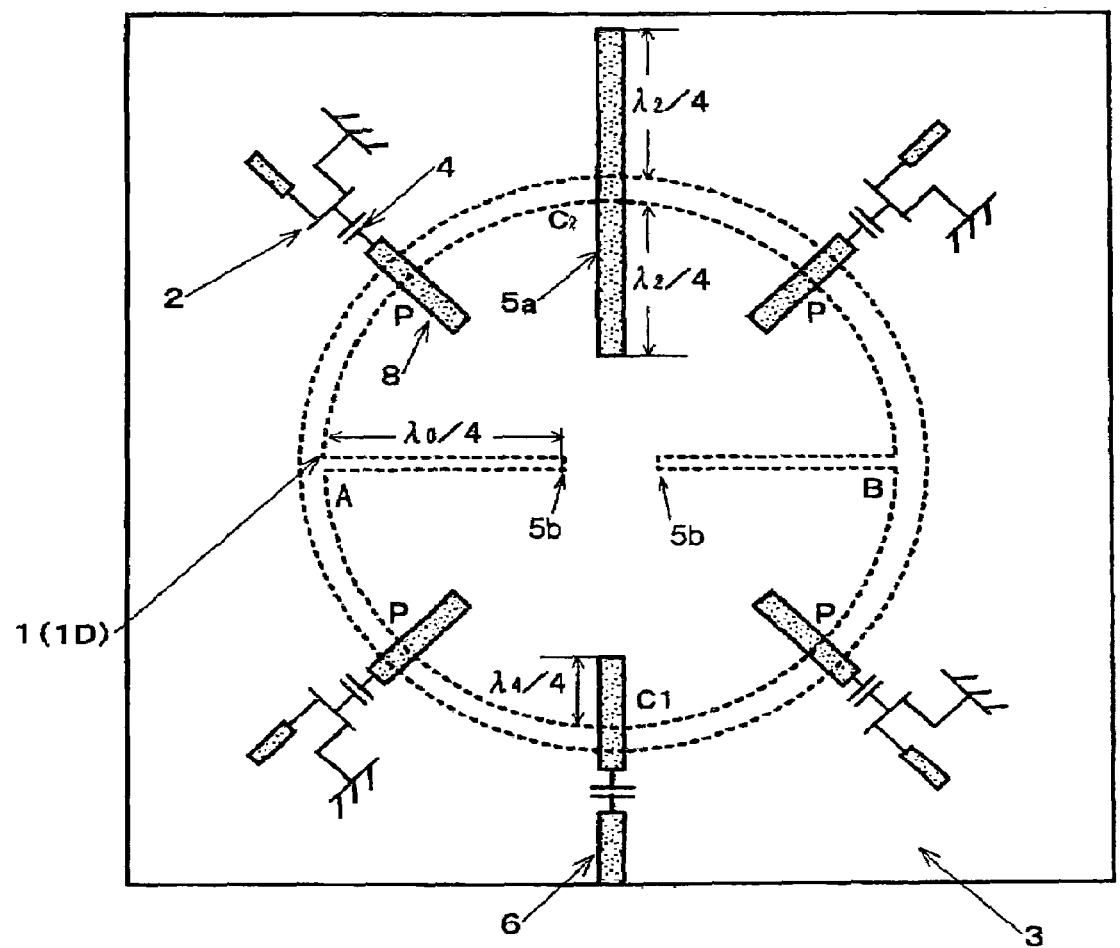
FIG. 10 is a plan view showing a configuration of the fourth harmonic oscillator according to the third embodiment of the present invention using a slot line resonator.

Although the fourth harmonic oscillator shown in FIG. 9A uses microstrip line ring resonator 1C as a transmission line resonator, a ring-like slot line resonator may be used instead of the microstrip line ring resonator. FIG. 10 shows a fourth harmonic oscillator using a slot line ring resonator. This fourth harmonic oscillator is the fourth harmonic oscillator shown in FIGS. 6A and 6B using slot line ring resonator 1D instead of the linear slot line resonator.

In the fourth harmonic oscillator, slot line ring resonator 1D is configured by providing an annular slot-like opening part in the ground conductor on the back side of substrate 3. Further, slot line stabs 5b having a length of $\lambda_0/4$ where $\lambda_0$ is a wavelength corresponding to fundamental wave $f_0$ are connected to left and right ends A, B in the figure, respectively, so that the ends act as electrical open ends for fundamental wave $f_0$. Thus, as in the case of microstrip line ring resonator 1C in the fourth harmonic oscillator shown in FIG. 9A, a standing wave of fundamental wave $f_0$ is generated in such a manner that left and right ends A, B of ring resonator 1D are maximum voltage displacement portions in opposite phase to each other and top and bottom ends C1, C2 are minimum voltage displacement portions.

Active elements 2 are electrically connected at positions P which are voltage displacement points for the fundamental wave and minimum voltage displacement points for second harmonic at a distance $\lambda_0/8$ from left and right ends A, B of slot line ring resonator 1D, respectively, as in the case shown in FIGS. 6A and 6B. Positions P act as maximum voltage displacement points for fourth harmonic. At positions P, feeding stabs 8 are provided on the surface of substrate 3 so that the stabs orthogonally traverse ring resonator 1D and project from the traversing point with ring resonator 1D. Feeding stabs 8 are electromagnetically coupled to ring resonator 1D. Active elements 2 are connected to feeding stabs 8. With the configuration in this manner, fundamental wave $f_0$ appears in ring resonator 1D and voltage displacement distributions of the fundamental wave and harmonics which are similar to that shown in FIG. 9 are obtained.

At the bottom end of slot line ring resonator 1D, i.e. at midpoint portion C1 of half circumferential arc, a microstrip line as output line 6 is provided which projects by a length of about $\lambda_4/4$ where $\lambda_4$ is a wavelength corresponding to fourth harmonic $4f_0$ and crosses ring resonator 1D. At the top end of ring resonator 1D, i.e. at midpoint portion C2 of the other half circumferential arc which is a position of a maximum voltage displacement portion for second harmonic, microstrip line stab 5a having a length of about $\lambda_2/4$ is provided which is an electrical short-circuit end for second harmonic and acts as a voltage dropping stab.

With this configuration, the fundamental wave and odd-order harmonics are suppressed by obtaining output from the midpoint of the half circumferential arc of slot line ring resonator 1D, and second harmonic is suppressed by electrical suppressing means in which active elements 2 are connected to minimum voltage displacement portions for second harmonic. Second harmonic is further suppressed by voltage dropping stab 5a as a physical suppressing means provided at maximum voltage displacement portion for second harmonic. Moreover, because output line 6 is matched to fourth harmonic, output of fourth harmonic can be efficiently obtained.

Fourth Embodiment

Figure 11:
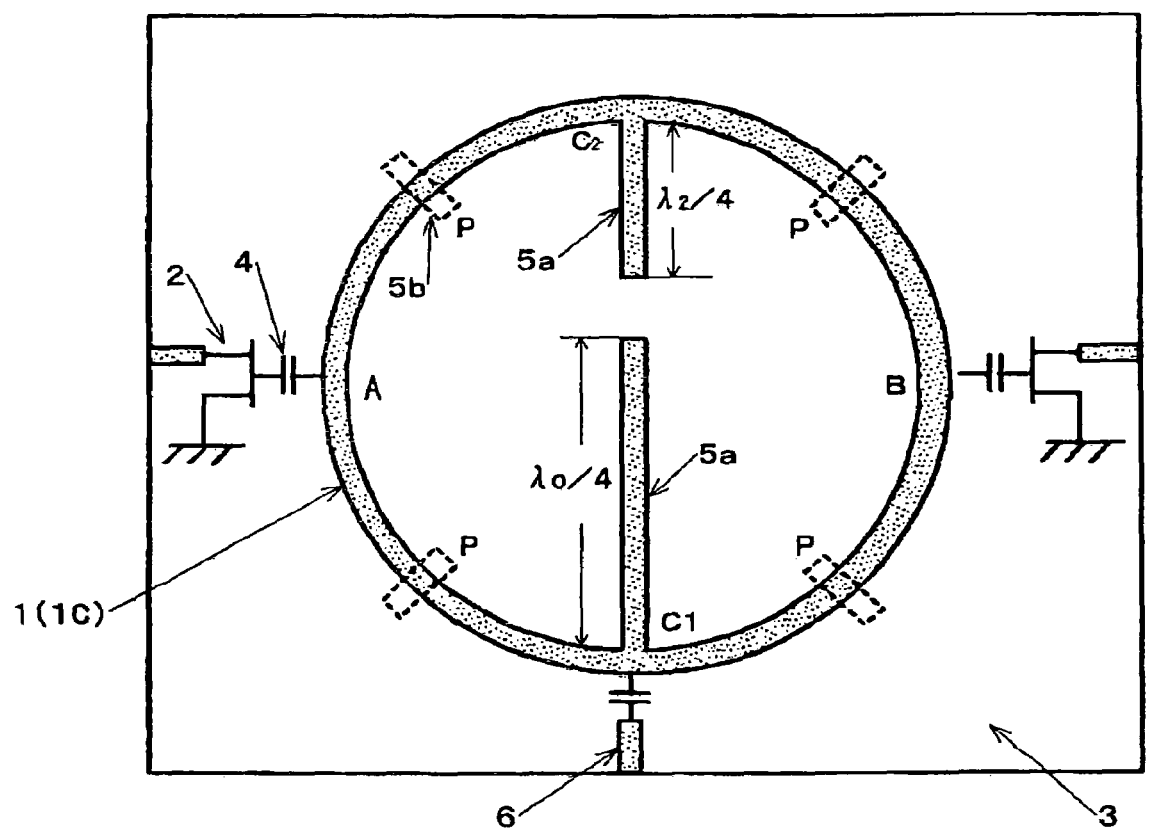
FIG. 11 is a plan view showing a configuration of a fourth harmonic oscillator according to a fourth embodiment of the present invention using a microstrip line resonator.

A fourth harmonic oscillator shown in FIG. 11 is the fourth harmonic oscillator shown in FIG. 7 using microstrip line ring resonator 1C as a transmission line resonator, instead of the linear microstrip line resonator.

In microstrip line ring resonator 1C in the fourth harmonic oscillator of this embodiment, as in the resonator shown in FIG. 9A, microstrip line stab 5a having a length of $\lambda_0/4$ which acts as an electrical short-circuit end for fundamental wave $f_0$ is provided to midpoint portion C1 of one half circumferential arc, so that top and bottom ends C1, C2 are minimum voltage displacement points and left and right ends A, B are maximum voltage displacement portions in opposite phase to each other for fundamental wave $f_0$. Active elements 2 for oscillation are connected to left and right ends A, B of ring resonator 1C, respectively, and these active elements 2 oscillate in opposite phase to each other as two oscillating systems. Thus, voltage displacement distributions of the fundamental wave and harmonics which are similar to that shown in FIG. 9B are obtained. Further, at positions P at a distance $\lambda_0/8$ from left and right ends A, B slot line stabs 5b having a length shorter than $\lambda_2/4$ are provided as physical suppressing means which act as electrical open ends for second harmonic. At top end C2, which is a minimum voltage displacement point for the fundamental wave and a maximum voltage displacement part for second harmonic, microstrip line stab 5a having a length of $\lambda_2/4$ is provided which acts as an electrical short-circuit end for second harmonic.

In this fourth harmonic oscillator, as in the oscillator shown in FIG. 9A, the fundamental wave is generated in such a manner that left and right ends A, B of microstrip line ring resonator 1C are maximum voltage displacement points and midpoint portions C1, C2 of respective half circumferential arcs are minimum voltage displacement points, and standing waves of even-order and odd-order harmonics are generated in a similar manner to that shown in FIG. 5B. Because output is obtained from midpoint portion C1 of one half circumferential arc of microstrip line ring resonator 1C, the fundamental wave, third harmonic, and odd-order harmonics are suppressed. In addition, as in the case shown in FIG. 7, slot line stabs 5b having a length of $\lambda_2/4$ provided at minimum voltage displacement portions (i.e. maximum current displacement portions) for second harmonic act as stabs for suppressing second harmonic. Microstrip line stabs 5a provided at maximum voltage displacement portions for second harmonic attenuate the voltage displacement distribution of second harmonic. Consequently, in this fourth harmonic oscillator, oscillation output of fourth harmonic can be efficiently obtained.

Figure 12:
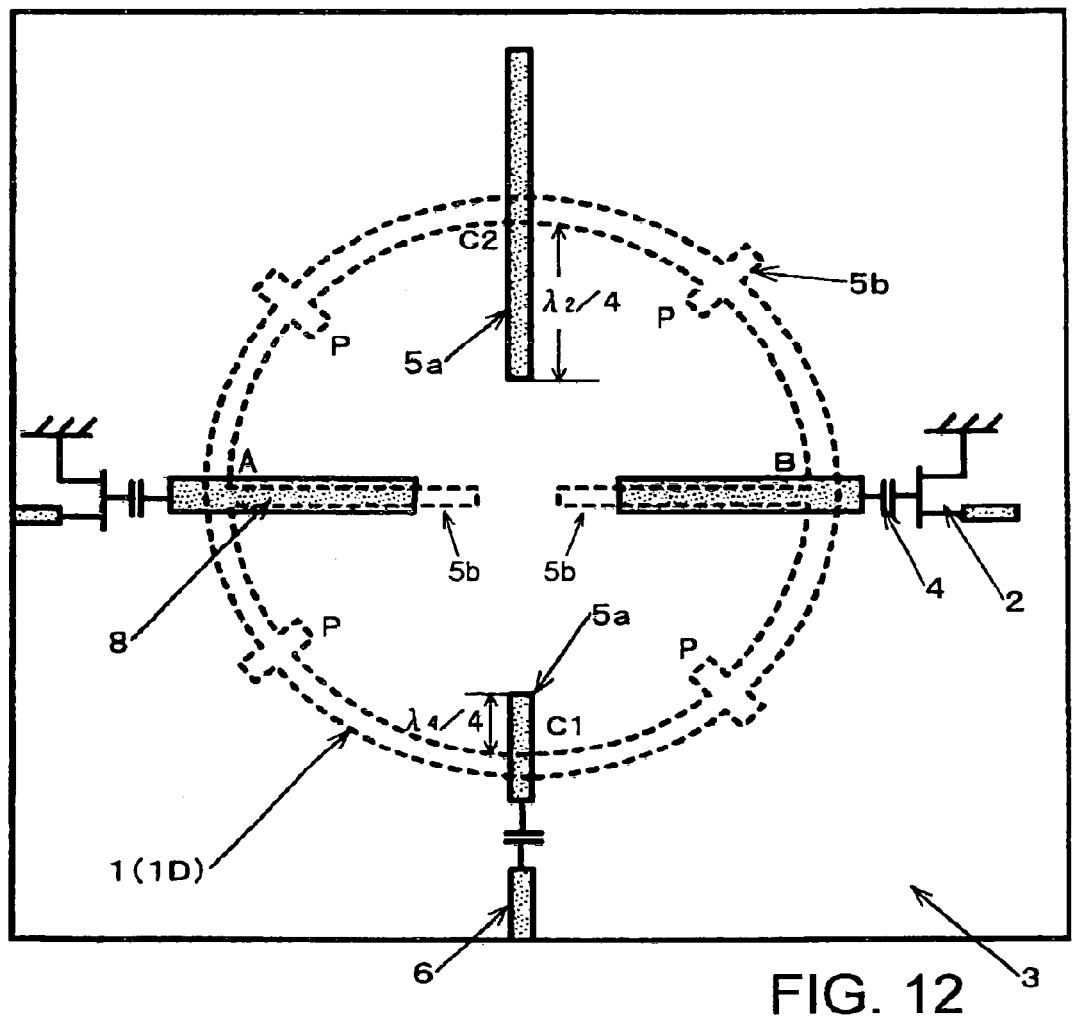
FIG. 12 is a plan view showing a configuration of the fourth harmonic oscillator according to the fourth embodiment of the present invention using a slot line resonator.

A fourth harmonic oscillator shown in FIG. 12 is the fourth harmonic oscillator shown in FIG. 8 using slot line ring resonator 1D as a transmission line resonator, instead of the linear slot line resonator. In slot line ring resonator 1D, as in the resonator shown in FIG. 10, slot line stabs 5b having a length of $\lambda_0/4$ which act as electrical open ends for fundamental wave $f_0$ are provided to left and right ends A, B, so that left and right ends A, B are maximum voltage displacement portions in opposite phase to each other and top and bottom ends C1, C2 are minimum voltage displacement points for fundamental wave $f_0$.

Active elements 2 for oscillation are connected at left and right ends A, B of slot line ring resonator 1D, respectively, and these active elements 2 oscillate in opposite phase to each other as two oscillating systems. Thus, voltage displacement distributions of the fundamental wave and harmonics which are similar to that shown in FIG. 9B are obtained. At positions P located at a distance $\lambda_0/8$ from left and right ends A, B, which are maximum voltage displacement parts for the fundamental wave, slot line stabs 5b having a length of $\lambda_2/4$ is provided as physical suppressing means which act as electrical open ends for second harmonic. At top end C2 which is a minimum voltage displacement point for the fundamental wave and a maximum voltage displacement portion for second harmonic, microstrip line stab 5a having a length of $\lambda_2/4$ is provided which acts as an electrical short-circuit end for second harmonic.

In this fourth harmonic oscillator, as in the oscillator shown in FIG. 10, the fundamental wave occurs in such a manner that left and right ends A, B of slot line ring resonator 1D are maximum voltage displacement portions and midpoint portions C1, C2 of respective half circumferential arcs are minimum voltage displacement points (zero potential points), so that even-order and odd-order harmonics are generated in a similar manner to that shown in FIG. 5B. Because output is obtained from midpoint portion C1 of one half circumferential arc of slot line ring resonator 1D, the fundamental wave, third harmonic, and odd-order harmonics are suppressed. In addition, as in the case shown in FIG. 8, slot line stabs 5b provided at minimum voltage displacement portions (i.e. maximum current displacement portions) for second harmonic act as stabs for suppressing second harmonic and microstrip line stabs 5a provided at maximum voltage displacement portions for second harmonic suppresses the voltage displacement distribution of second harmonic. Consequently, in this fourth harmonic oscillator, oscillation output for fourth harmonic can be efficiently obtained.

Fifth Embodiment

Although the fourth harmonic oscillators have been described in the above described first to fourth embodiments by way of example for the harmonic oscillator according to the present invention, the present invention is not limited to these embodiments. The present invention is also applicable to second harmonic oscillators, for example.

Figure 13:
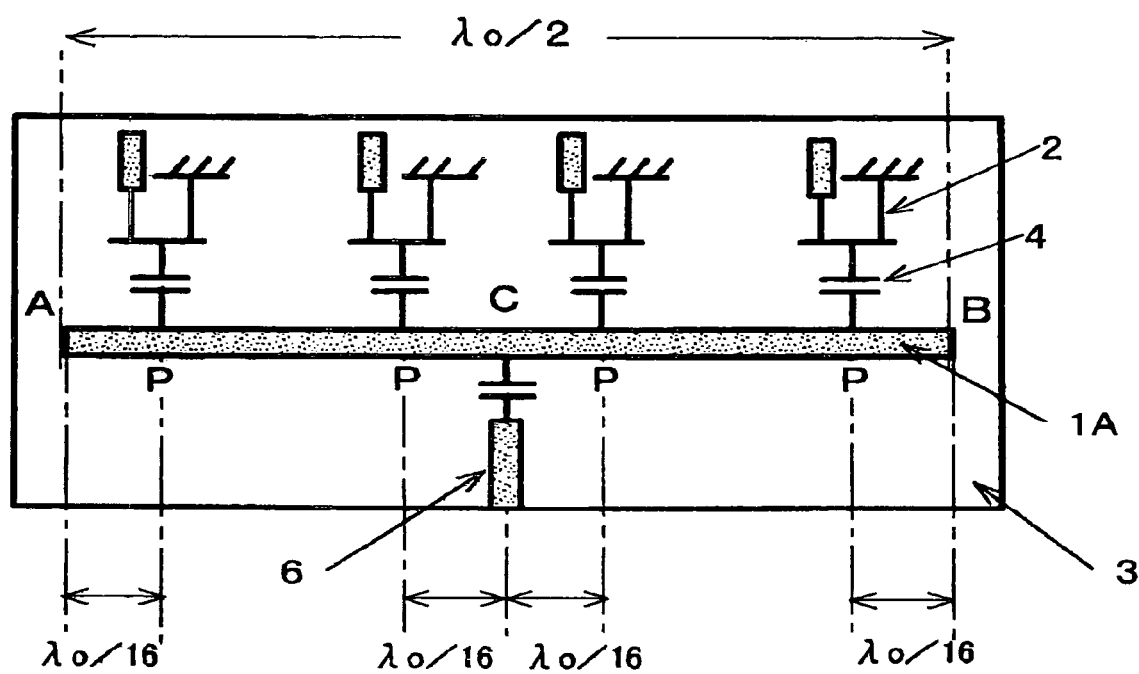
FIG. 13 is a plan view showing a configuration of a second harmonic oscillator according to a fifth embodiment of the present invention using a microstrip line resonator.

A second harmonic oscillator according to a fifth embodiment of the present invention shown in FIG. 13 is a second harmonic oscillator modified from the fourth harmonic oscillator shown in FIGS. 3A and 3B, in which linear microstrip line resonator 1A is used as a transmission line resonator.

In the fourth harmonic oscillator shown in FIGS. 3A and 3B, active elements 2 for oscillation are provided as electrical suppressing means for suppressing second harmonic at positions at a distance $\lambda_0/8$ from either ends of microstrip line resonator 1A toward the midpoint, i.e. positions of minimum voltage displacement points for second harmonic. On the other hand, in the second harmonic oscillator of the fifth embodiment shown in FIG. 13, active elements 2 are connected to positions of minimum voltage displacement points for fourth harmonic in order to suppress fourth harmonic. Specifically, active elements 2 are provided at four points, i.e. two points at a distance $\lambda_0/16$ from either ends A, B of microstrip line resonator 1A toward midpoint portion C and two points at a distance $\lambda_0/16$ from midpoint portion C toward either ends A, B.

Figure 14:
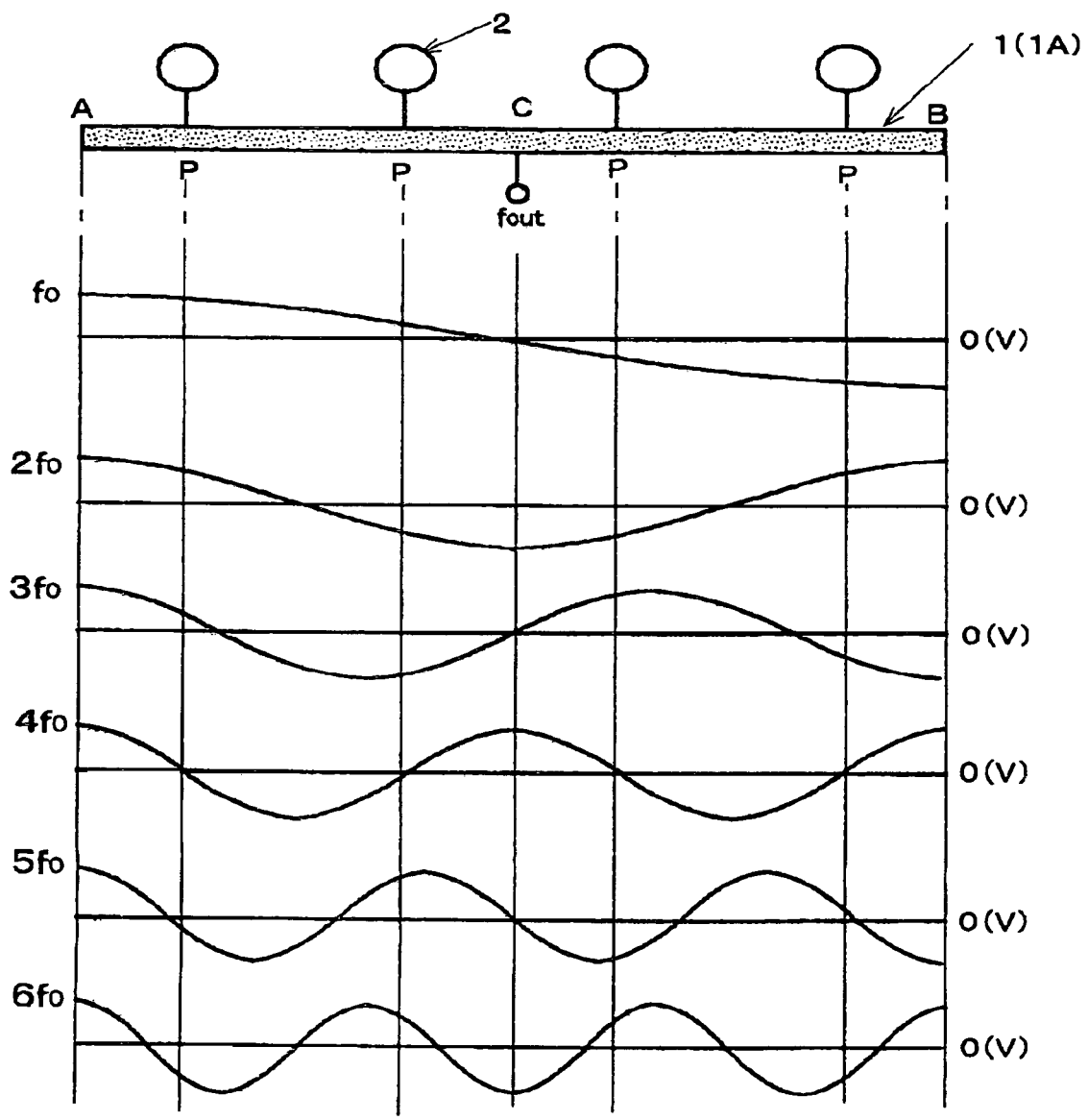
FIG. 14 is a view showing voltage displacement distributions of the fundamental wave and second to sixth harmonic components in the fourth harmonic oscillator shown in FIG. 13.

With this configuration, as in the configuration shown in FIGS. 3A and 3B, the fundamental wave and odd-order harmonics are suppressed because output is obtained from the midpoint portion of microstrip line resonator 1A. All of the points at a distance $\lambda_0/16$ from either ends A, B of the microstrip line resonator 1A and the points at a distance $\lambda_0/16$ from the midpoint portion are minimum voltage displacement points (zero potential points) for fourth harmonic and active elements 2 are provided at these points. Therefore, fourth harmonic tends not to be generated in resonator 1A even if amplification outputs are injected to these points. As a result, the voltage displacement distribution and related output level of fourth harmonic among even-order harmonics are suppressed. FIG. 14 shows voltage displacement distributions of the fundamental wave and harmonics in the second harmonic oscillator shown in FIG. 13.

In this way, in the second harmonic oscillator shown in FIG. 13, the fundamental wave and odd-order harmonics are suppressed by positioning of connection of the output line and fourth harmonic is suppressed by the electrical suppressing means, so that oscillation output of second harmonic can be increased while suppressing the unnecessary waves. Although a transmission line oscillator is linear microstrip line resonator 1A in the fifth embodiment in this description, a linear slot line resonator, a microstrip line ring resonator, or a slot line ring-resonator may be used instead, as shown in the first to fourth embodiments. In addition, although the example has been described in which active elements 2 are provided at all of minimum voltage displacement points for fourth harmonic, active elements may be provided at only two points which are symmetric with respect to the midpoint portion, for example.

Although the amplification level of fourth harmonic becomes larger than that of the fundamental wave, second harmonic, and third harmonic in the first to fourth embodiments described above, the output level of fourth harmonic may be not sufficient in comparison with the fundamental wave, second harmonic, and third harmonic if the level of fourth harmonic component in oscillation output of active element 2 itself is too small. Also in this case, the fundamental wave, second harmonic, and third harmonic are suppressed so that oscillation output including fourth harmonic dominantly can be obtained by using a simple filter or the like.

The harmonic oscillator according to the present invention can be integrated in a monolithic IC with the three-dimensional MMIC (monolithic microwave integrated circuit) technology or the like. Further, because 4n-th harmonics having the order of four or more can be obtained, oscillation output having eighth harmonic or sixteenth harmonic as a main component may be obtained, if desired.

In addition, although the transmission line resonator is the microstrip line resonator or the slot line resonator in this description, the present invention is not limited to these embodiments. For example, a coplanar line resonator may be used. Further, the number of oscillation active elements is not limited to be 2 or more. The present invention is applicable as long as a standing wave of a half wavelength of the fundamental wave occurs in the transmission line resonator.

What is claimed is:

1. A harmonic oscillator comprising:
    a transmission line resonator in which an oscillation frequency depends on an electrical length of a transmission line and both ends of the transmission line are electrical open ends; and
    an active element for oscillation as a negative resistance connecting to the transmission line resonator, the harmonic oscillator using the transmission line resonator in which
    each standing wave of a fundamental wave of the oscillation frequency and odd-order harmonics related to the fundamental wave has a minimum voltage displacement portion at a midpoint portion of the transmission line resonator and maximum voltage displacement portions in opposite phase to each other at both ends and the standing wave has a voltage displacement distribution which is odd-symmetric with respect to the midpoint portion;
    each standing wave of even-order harmonics related to the fundamental wave has a maximum voltage displacement portion at the midpoint portion of the transmission line resonator and maximum voltage displacement portions in phase or opposite phase in relation to the midpoint portion at both ends and the standing wave has a voltage displacement distribution which is symmetric with respect to the midpoint portion; and
    an output line is connected to the midpoint portion of the transmission line resonator to suppress output levels of the fundamental wave and odd-order harmonics, and the even-order harmonics are obtained on the output line, wherein
    in the transmission line resonator, suppressing means is provided for suppressing a voltage displacement distribution of second harmonic among the even-order harmonics; and
    the suppressing means is provided at a position between the midpoint portion and either ends of the transmission line resonator, the position being at least a minimum voltage displacement portion for the second harmonic.

2. The harmonic oscillator according to claim 1, wherein the output levels of the fundamental wave, the odd-order harmonics, and the second harmonic are suppressed and an output level of fourth harmonic among the even-order harmonics is largest so that the fourth harmonic is outputted as a main component.

3. The harmonic oscillator according to claim 1, wherein at least two active elements are provided and the harmonic oscillator has two oscillating systems which oscillate in opposite phase to each other with the transmission line resonator in common.

4. The harmonic oscillator according to claim 1, wherein the suppressing means is configured by connecting the active element to a position of a minimum voltage displacement portion for the second harmonic between the midpoint portion and either ends of the transmission line resonator.

5. The harmonic oscillator according to claim 4, wherein both ends of the transmission line resonator are unloaded ends.

6. The harmonic oscillator according to claim 1, wherein the suppressing means is a stab for suppressing the second harmonic, the stab being provided to a minimum voltage displacement portion for the second harmonic between the midpoint portion and either ends of the transmission line resonator.

7. The harmonic oscillator according to claim 6, wherein the active elements connect to both ends of the transmission line resonator.

8. The harmonic oscillator according to claim 1, wherein the suppressing means is a stab for dropping voltage of the second harmonic, the stab being provided at the midpoint portion of the transmission line resonator.

9. The harmonic oscillator according to claim 8, wherein both ends of the transmission line resonator are unloaded ends.

10. The harmonic oscillator according to claim 8, wherein the active elements connect to both ends of the transmission line resonator.

11. The harmonic oscillator according to claim 1, wherein the transmission line resonator is formed as a linear transmission line having a length of $\lambda_0/2$ where $\lambda_0$ is a wavelength of the fundamental wave and both ends of the transmission line are electrical open ends.

12. The harmonic oscillator according to claim 1, wherein the transmission line resonator is formed as an annular transmission line having a length of $\lambda_0$ where $\lambda_0$ is a wavelength of the fundamental wave and an imaginary electrical open end is provided as a maximum voltage displacement portion of the fundamental wave for each length of $\lambda_0/2$ in the annular transmission line.

13. The harmonic oscillator according to claim 1, wherein the transmission line resonator is a microstrip line resonator.

14. The harmonic oscillator according to claim 1, wherein the transmission line resonator is a slot line resonator.

15. A harmonic oscillator comprising:

a transmission line resonator in which an oscillation frequency depends on an electrical length of a transmission line and both ends of the transmission line are electrical open ends; and an active element for oscillation as a negative resistance connecting to the transmission line resonator, the harmonic oscillator using the transmission line resonator in which each standing wave of a fundamental wave of the oscillation frequency and odd-order harmonics related to the fundamental wave has a minimum voltage displacement portion at a midpoint portion of the transmission line resonator and maximum voltage displacement portions in opposite phase to each other at both ends and the standing wave has a voltage displacement distribution which is odd-symmetric with respect to the midpoint portion;

each standing wave of even-order harmonics related to the fundamental wave has a maximum voltage displacement portion at the midpoint portion of the transmission line resonator and maximum voltage displacement portions in phase or opposite phase in relation to the midpoint portion at both ends and the standing wave has a voltage displacement distribution which is symmetric with respect to the midpoint portion; and an output line is connected to the midpoint portion of the transmission line resonator to suppress output levels of the fundamental wave and odd-order harmonics, and the even-order harmonics are obtained on the output line, wherein in the transmission line resonator, suppressing means is provided for suppressing a voltage displacement distribution of fourth harmonic among the even-order harmonics; and the suppressing means is provided at a position between the midpoint portion and either ends of the transmission line resonator, the position being at least a minimum voltage displacement portion for the fourth harmonic.

* * * * *